(12) United States Patent
Elschner et al.

(10) Patent No.: US 7,710,692 B2
(45) Date of Patent: May 4, 2010

(54) SUPERCONDUCTOR COMPONENT WITH IMPROVED ELECTRICAL CONTACT

(75) Inventors: Steffen Elschner, Heidelberg (DE); Frank Breuer, Bonn (DE); Heribert Walter, Erftstadt (DE); Simon Krämer, Brühl (DE); Zülfükil Tas, Siegburg (DE)

(73) Assignee: Nexans, Paris (FR)

( * ) Notice: Subject to any disclaimer, the term of this patent is extended or adjusted under 35 U.S.C. 154(b) by 221 days.

(21) Appl. No.: 11/825,511

(22) Filed: Jul. 6, 2007

(65) Prior Publication Data
US 2008/0144247 A1    Jun. 19, 2008

(30) Foreign Application Priority Data
Jul. 6, 2006   (EP) .................................. 06300771

(51) Int. Cl.
*H02H 7/00*   (2006.01)
*H02H 9/00*   (2006.01)
*H02H 9/08*   (2006.01)
*H01F 1/00*   (2006.01)
*H01F 6/00*   (2006.01)

(52) U.S. Cl. ..................... 361/19; 361/93.9; 335/216

(58) Field of Classification Search .................. 361/19
See application file for complete search history.

(56) References Cited

U.S. PATENT DOCUMENTS

| 3,336,548 | A | 8/1967 | Atherton ....................... 335/216 |
| 7,180,396 | B2 * | 2/2007 | Bock et al. ................... 336/100 |
| 7,283,339 | B2 * | 10/2007 | Tekletsadik ................... 361/19 |
| 7,352,267 | B2 * | 4/2008 | Bock et al. ................... 335/216 |
| 2006/0217269 | A1 * | 9/2006 | Bock et al. ................... 505/191 |

OTHER PUBLICATIONS

European Search Report dated: Nov. 23, 2006.

\* cited by examiner

*Primary Examiner*—Ronald W Leja
*Assistant Examiner*—Dharti H Patel
(74) *Attorney, Agent, or Firm*—Sofer & Haroun, LLP

(57) ABSTRACT

The present invention is directed to a superconductor component 1 suitable as fault current limiter comprising a superconductor body 2 provided with a shunt coil 3 and an electrical contact 4 on at least one end of the superconductor body 2 wherein the superconductor component 2 is provided with means for reducing currents 6 induced within the electrical contacts 4.

14 Claims, 2 Drawing Sheets

SUPERCONDUCTOR COMPONENT WITH IMPROVED ELECTRICAL CONTACT

RELATED APPLICATION

This application claims priority to European Patent Application No. 06 300 771.0, filed on Jul. 6, 2006, the entirety of which is incorporated herein by reference.

FIELD OF THE INVENTION

The present invention relates to a superconductor component comprising a superconductor body provided with a shunt coil and electrical contacts at the ends of the superconductor body. The superconductor component of the present invention has improved mechanical stability of the connection between the superconductor body and the electrical contacts.

In particular, the present invention relates to such superconductor component suitable as fault current limiter.

BACKGROUND

Fault current limiters serve to prevent unacceptable large current surges in modern power systems, in particular high power systems, due to any fault event such as short circuits etc and, thus, protect the power systems from damage.

Superconductors, in particular ceramic oxide high temperatures superconductors, offer a great potential as fault current limiters which enable rapid and effective current limitation, automatic recovery, negligible impedance during normal operation and application at high voltage.

Current limiters based on high temperature superconductor materials make use of the property of such superconductor materials to switch from their superconducting state with essentially no resistance at normal operation conditions to a resistive state if at least one of its critical temperature (Tc), critical magnetic field (Hc) or critical current (Ic) is exceeded.

For example, in case of fault the current flowing through a superconductor material exceeds the critical current of the superconductor material due to large surge current and the superconducting material undergoes transition from the superconducting to the non-superconducting state with resistance. This transition is also termed "quenching".

However, in practice, the material of superconductor bodies shows inhomogeneities causing non-uniform quenching wherein some regions of the superconductor body becomes resistive before other regions of the body. In this case the already quenched part of the superconductor body is overheated and may burn out leading to destruction of the superconductor body.

For solving the problem of local overheating and for obtaining a fast and uniform transition of the superconductor to the non-superconducting resistive state it is known to provide the superconductor body with a shunt of normal conductive material the resistance of which being lower than the resistance of the superconducting material in its normal conducting state. In case of a sudden temperature increase during quench the current is bypassed to the shunt and heat is dissipated from the superconductor body.

Furthermore, for avoiding local burn out triggering techniques are known promoting fast and uniform transition of the superconductor material from its superconducting state to the non-superconducting state.

One of these techniques makes use of the fact that the critical current density of a given superconductor material decreases if an applied magnetic field increases. According to this triggering technique an external magnetic field is applied to the superconductor body in case of fault event. By that magnetic field the critical current density is reduced which, in turn, promotes quenching.

A superconductor component particularly suitable as fault current limiter with magnetic field assisted quenching is disclosed in EP 1 524 748 A, which is included herein by reference.

The superconductor component of said patent application comprises a superconductor body of low inductive shape such as a rod, tube or plate, preferably a rod or tube with essentially round cross-sectional geometry. Around that superconductor body a coil is wound being made of a normal conductive material, such as a metal. That coil is electrically connected in parallel to the superconductor body wherein the ends of the coil are usually fixed to the respective end sections of the superconductor body.

In fault event, i.e. when the critical current is exceeded, the superconductor material starts to quench. Resistance and corresponding voltage (flux flow) are built up which causes that a part of the current is bypassed automatically to the parallel connected coil without any external control.

Due to the current now flowing through the coil a magnetic field is built up which, in turn, reduces the critical current density of the superconductor material. In the consequence the fault current limiter of this patent application has a so-called self-triggering design triggering the quench automatically without external control.

In practice a plurality of such superconductor components is connected in series for forming a fault current limiter.

In order to connect the fault current limiter with a power system or with each other electrical contacts are provided at the ends of the superconductor component.

As is clear from the above such superconductor components have to withstand high mechanical, thermal and magnetic forces especially during fault events.

For example, it has been observed that in known high temperature fault current limiters of a design as set out above with a superconductor body with a shunt coil wound around its outside diameter the superconductor body is liable to be broken or weakened in the region of connection of the superconductor body with the electrical contacts, that is at the end section.

It is this end section where the coil ends. That is, the electrical contacts are located at the region of the ends of the coil.

Considering the shape of the magnetic field of a current carrying coil this field is uniform at the middle part of the coil whereas at the coil ends, in particular at the exit site of the magnetic field from the coil interior, the field becomes non-uniform and especially has components parallel to the radius ("radial components").

As set out in more detail in the following, it is believed by the present inventor that the reason for the observed damages are forces generated by currents induced in the electrical contact by the magnetic field and the interaction of these currents with the radial components of the magnetic field.

For the present invention the term "non-uniformity" of the magnetic field relates to the radial components of this field.

OBJECT AND SUMMARY

It is the object of the present invention to provide such superconductor component with improved stability at the connections of the electrical contacts to the superconductor body.

In particular, it is the object of the present invention to provide a superconductor component which has a design with reduced forces acting on the electrical contacts.

U.S. Pat. No. 3,336,548 relates to means for reducing eddy current losses in a superconducting circuit wherein the eddy currents are produced by a rotating permanent magnet on a plate-shaped superconductor body on rotation of the permanent magnet over the plate-shaped superconductor body.

For reducing eddy current losses the plate-shaped superconductor body is divided by an insulating media into stripes roughly along or parallel to the mean current flow part of the current flowing about the circuit. By the insulating media eddy currents are prevented. There is no indication of the problem of the present invention caused by the non-uniformity of a magnetic field created by a current carrying coil. In particular, there is no indication as to the problems caused by induced circulating current.

According to the present invention a superconductor component is provided comprising a superconductor body provided with a shunt coil and electrical contacts on both ends of the superconductor body wherein the shunt coil is physically wound around the superconductor body and wherein the superconductor component comprises means for reducing the circulating current which is induced within the electrical contacts by a magnetic field on current flow within the shunt coil.

According to the present invention a superconductor component is provided being designed to have reduced induced currents in the electrical contacts. Further according to the present invention a method is provided for reducing currents induced in the electrical contacts as well as the use of such superconductor component in fault current limiters.

For the present invention the superconductor body may assume any shape, a non or low inductive form such as a bar, a rod, a tube, a bifilar coil etc being preferred.

The term "non or only low inductive form" means a three dimensional form which allows the flow or generation of circular screening currents within the superconductor body. These screening currents add up to the transport fault current and therefore support the transition to the normal conducting state. For a circular flow of the current it is necessary that the external surface of the superconductor body has a continuous perimeter, that is a perimeter without interruption.

The superconductor body of the present invention may assume any cross sectional geometry such as a round or oval geometry, or any polygonal geometry such as a square, rectangular, pentagonal or hexagonal geometry, a round or oval geometry, however, being preferred.

However, the present invention is likewise useful in any superconductor body irrespective of its shape.

For electrically connecting high temperature superconductor components as referred to above with a power system, for example, an electrical source or load or other superconductor component, the end sections of the high temperature superconductor component and, respectively, the high temperature superconductor body of said component to be connected are usually designed as electrical contacts.

Electrical contacts can be made, for example, by surrounding the high temperature superconductor component in the periphery of the end sections with an electrically conductive material. Typically, a metal is used such as copper or copper alloy without being restricted thereto.

Preferably the entire periphery of the end sections of the high temperature superconducting component is surrounded by the electrical contact.

Preferably the electrically conductive material is in this case in contact with the high temperature superconductor material in the region of the end section as to provide the lowest possible function resistance when current is transferred from or to the power system through the electrically conductive material to the high temperature superconductor material or vice versa.

Generally, such electrical contacts, production methods thereof, methods for connecting to a superconductor body and materials suitable are well-known in the art.

Any ceramic oxide high temperature superconductor material (referred to in the following as HTSC) may be used for the superconductor body of the present invention.

HTSC is usually defined to have an onset or critical temperature (Tc) above the temperature of liquid nitrogen.

Preferably, the HTSC is selected from a group consisting of bismuth-based HTSC, yttrium-based HTSC, thallium-based HTSC and mercury-based HTSC.

Typical examples may be represented by the following general formulas: Bi—Ae—Cu—O, (Bi,Pb)—Ae—Cu—O, Y—Ae—Cu—O, (Y—Re)—Ae—Cu—O or (Tl,Pb)—(Ae—Y)—Cu—O.

In the above formulas Ae means at least one alkaline earth element, particularly, Ba, Ca and/or Sr. Re means at least one rare earth element different from Y, particularly La, Lu, Sc, Sm, Nd or Yb.

Especially suitable HTSC are those known by the reference BSCCO-2212, BSCCO-2223, wherein the numerical combinations 2212 and 2223 stand for the stoichiometric ratios of the elements Bi, Sr, Ca and Cu, in particular those, wherein part of Bi is substituted by Pb; and those known by the reference YBCO-123 and YBCO-211, wherein the numerical combinations 123 and 211 stand for the stoichiometric ratios of the elements Y, Ba and Cu.

In the present invention particularly preferred are HTSC bodies produced using a melt casting method, in particular a centrifugal casting method as disclosed, for example, in DE-A-38 30 092, EP-A-0 451 532, EP-A-0 462 409 and EP-A-0 477 493, to which reference is likewise expressly made.

According to the present invention the shunt coil is physically wound around the superconductor body with the superconductor body being positioned essentially concentrically within the coil.

Preferably, the coil is connected to the surface of the superconductor body only at its ends. This connection can be done by soldering or similar means.

Suitable methods for connecting the shunt coil to the superconductor body are well-known in the art.

The shunt coil can be made of a normal conductive metal, for example the same chosen for the electrical contacts, as well as of a superconductor material.

Suitable metals are copper, copper alloys, steel etc. Examples for superconductor materials are tapes, e.g. made of BSCCO-type material or YBCO thin-films.

In case of a shunt coil made of superconductor material a sufficiently high contact resistance or similar means should be provided in order to avoid premature current flow in the coil.

Preferably, the shunt coil is connected to the superconductor body electrically in parallel. Superconductor components with a shunt coil connected electrically in parallel to the superconductor body are explained in very detail in the above referenced EP 1 524 748 A of the present applicant to which reference is likewise expressly made.

Considering the superconductor body the shunt coil ends where the electrical contacts are located. The reason therefore is of practical nature for facilitating mounting of connectors via which the superconductor component is connected to the assembly, such as the power system etc.

Consequently, according to an embodiment of the present invention at least part of the electrical contacts protrudes over the coil ends. Though this design is preferred in view of practical reasons the contacts are here located in the non-uniform field region of the coil.

BRIEF DESCRIPTION OF THE DRAWINGS

In the following the present invention is explained in more detail by reference to the accompanying figures, which are for illustrative purposes only without being restricted thereto.

It is shown in FIGS. 1 and 2 a schematical longitudinal section through an embodiment of a superconductor component of the present invention.

Figure 3:
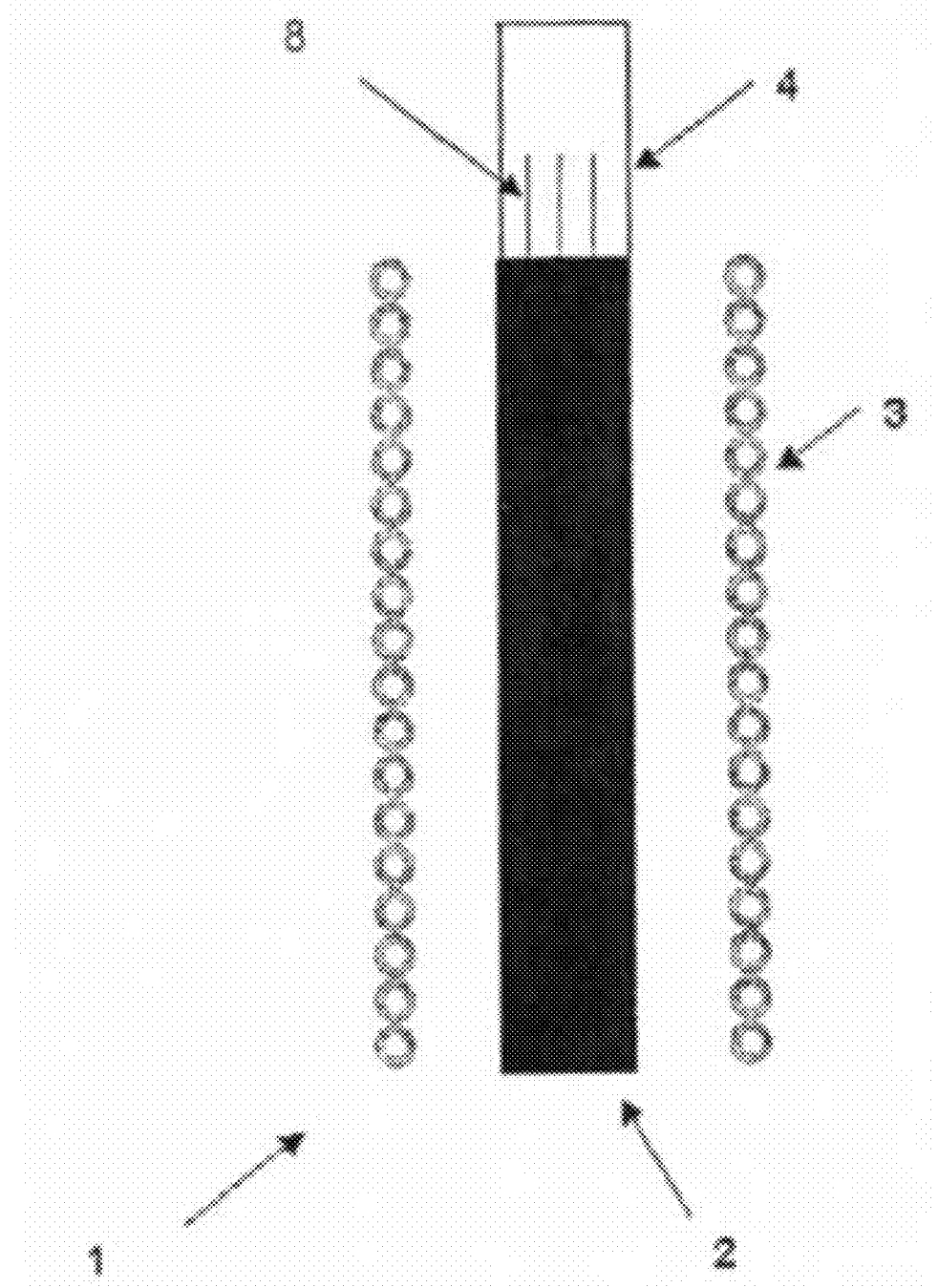

It is shown in FIG. 3 wherein the cuts are provided on the surface of the electrical contacts.

DETAILED DESCRIPTION

The superconductor component 1 shown in the figures comprises a superconductor body 2 inside a coil 3 and an electrical contact 4 provided on one end section of the superconductor body 2.

The coil 3 is physically wound around superconductor body 2. Preferably the coil 3 is connected electrically in parallel to the superconductor body 2 to allow a self-triggering design.

As can be seen in the figures the coil ends close to the region where the electrical contact 4 is provided.

Figure 1:
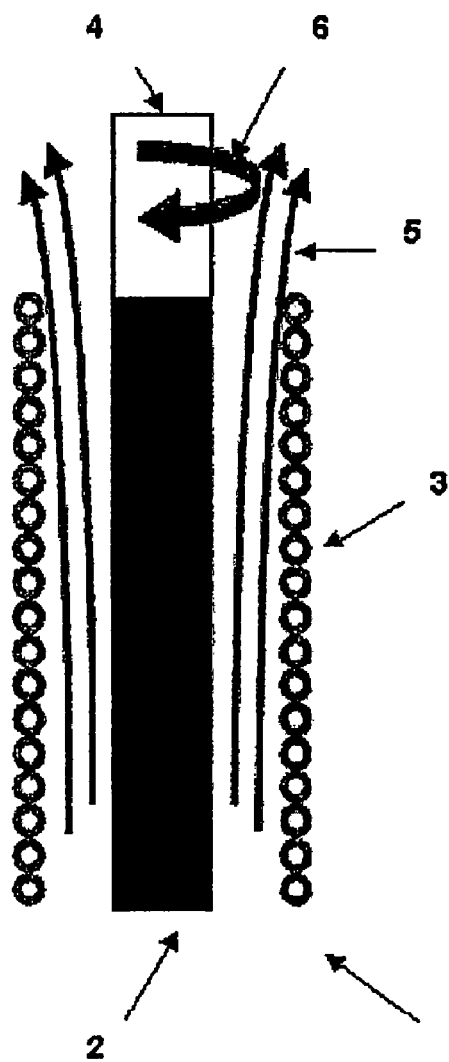

As is clear from the theory of current carrying coils when current flows through the coil 3 a magnetic field is generated. In FIG. 1 the magnetic flux lines inside the coil 3 are indicated by arrows 5.

Considering the shape of the magnetic flux lines in the middle portion of the longitudinal extension of the coil the flux lines are parallel to the longitudinal axis of the coil, that is, in this region the magnetic field is homogenous and essentially in parallel to the longitudinal axis of the coil 3 with essentially axial components only.

However at the ends of the coil 3 at the region where electrical contacts 4 are provided the flux lines diverge from their direction parallel to the longitudinal axis. In this region of diverging flux lines the magnetic field is no longer uniform with axial components but non-uniform and in particular has components parallel to the radius of the coil.

The axial component of the magnetic field induces circulating currents (indicated by arrow 6 in FIG. 1) within electrical contact 4. The radial component induces additional eddy currents within contact 4. Both induced currents interact with the inhomogeneous radial component of the magnetic field and create a Lorentz force.

Figure 2:
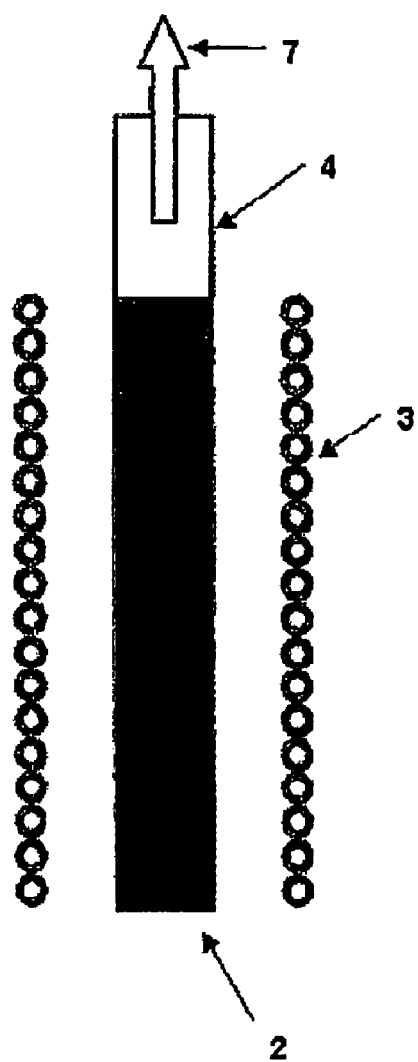

In FIG. 2 the direction of the resulting Lorentz force acting on electrical contact 4 is indicated by arrow 7. From symmetry considerations it is clear, that a similar force with opposite direction is acting at the contact on the other end of the superconductor component.

Moreover, these Lorentz forces induced by the non-uniformity of the magnetic field at the end regions of the coil 3 can be huge, in particular, when considering that these forces increase with the square of the coil current.

That is, the basic reason for the generation of the damaging forces within the electrical contacts is the non-uniformity and in particular the existence of a radial component of the magnetic field at the region of the superconductor component where the electrical contacts are applied.

In view of the above one solution could be to shift the end of the coil so that the electrical contacts are no longer within the region of non-uniform magnetic field. This could be done by extending the coil over the end regions of the superconductor body with the electrical contacts so that the electrical contacts come to lie within a region of homogenous magnetic field. Alternatively the coil could be shortened so that the region of non-uniformity does no longer extend to the electrical contacts.

Both solutions, however, have severe practical drawbacks.

Extending the coil over the end regions would mean that fixing the electrical contacts to any connectors of the power system, which are outside of the coil, becomes difficult. Shortening the coil would mean that a considerable portion of the superconductor body is no longer surrounded by the coil with the consequence, that there is no magnetic field in these regions for promoting quenching. In the result, in fault event such superconductor body would quench non-uniformly.

According to the present invention the problems discussed above are solved, in principle, by providing means for reducing the currents induced by the axial component of the magnetic field. Reducing the currents induced means a reduction of the Lorentz forces generated within the electrical contacts.

According to one embodiment of the present invention, as shown in FIG. 3, cuts are provided in the surface of the electrical contacts 4.

Furthermore, it has been shown that also eddy currents are reduced by the provision of such cuts.

In view of an interruption of circular current as completely as possible, preferably the cuts are through-cuts which completely separate the respective left and right portion of the electrical contact.

The number of cuts is not particularly critical and can be determined in accordance to need. That is, for example, for small components only one cut can be sufficient. Preferably, the number of the cuts is, however, at least 2, more preferably 4 or more, particularly preferred are 4 to 8.

Any run can be selected for the at least one cut provided that generation of circular currents are prevented to the desired extent. That is, the cut can be in parallel to the longitudinal axis of the contact or may deviate from the longitudinal axis of the contact, for example the cut can be inclined or may have a helical run. However, a parallel run of the cut being preferred.

Further, in case of more than one cut some of the cuts can have runs different from each other.

According to one embodiment of the present invention the cuts extends essentially from one end of the electrical contact to its other end.

As set out above, the design of the cuts is such that generation of circular current within the contact is at least partially prevented in order to improve the stability of the connection site of the electrical contact to the superconductor body and thereby avoiding damages at this region of non-uniform magnetic field. That is, the cuts have to be made in a way that preferably no closed pathes are left for the current.

According to one embodiment of the present invention the cuts are provided only at that end of the electrical contact particularly exposed to the non-uniform magnetic field, usually the end directed towards the superconductor body, rather than extending from one end to the other end. The longitudinal extension of such cuts is selected according to need depending on the strength of the non-uniform components of the magnetic field.

For the present invention such cuts provided only at one end of the electrical contact, that is, cuts not extending essentially from one end of the contact to the other, are referred to "indents".

The cuts or one or more of them can be filled with a suitable insulating or electrically only poor conductive material. Such filling of the cuts with insulation material serves to improve the stability.

According to another embodiment of the present invention the induced currents are reduced by decreasing the ratio of the cross sectional area of the electrical contact and of the superconductor body.

As set out above, the electrical contacts surround the outer surface of the superconductor body at its end regions. That is, for example, if the superconductor body has a tubular configuration, also the electrical contact has a tubular configuration.

Usually, the wall thickness of the electrical contact is chosen to result in a cross sectional area which is about two to ten times the cross sectional area of the superconductor body.

According to the present invention the wall thickness of the electrical contact is selected to result in a ratio of the cross sectional area of the electrical contact and of the superconductor body to be less than 2, preferably to be less than 1.8 and, particularly preferred, to be less than 1.6.

The reduction of the wall thickness of the electrical contacts leads to an enhancement of the resistance in the material. Due to this enhanced resistance also the resulting induced current and eddy current are reduced. However, as is clear, since for the electrical contact a contact resistance as low as possible is of desire, reduction of the wall thickness should be limited.

In view of the increase of contact resistance the ratio of the cross sectional area of the electrical contact and of the superconductor body should not be less than 1. If this ratio is less than 1 the contact resistance of the electrical contact under normal operation conditions in the cooled state and at rated current might become to high.

Of course, for the superconductor component of the present invention having a design with reduced induced circular and eddy currents in the electrical contacts 4 any combination of the above means and methods, respectively, can be applied, such as 1) providing (longitudinal) cuts in the wall of the electrical contact 4; and
2) adjusting the ratio of the cross sectional area of the electrical contact and the cross sectional area of the superconductor body 2 to be less than 2, preferably to be less than 1.8.

The invention claimed is:

1. A superconductor component comprising:
   a superconductor body provided with a shunt coil and electrical contacts on the ends of the superconductor body, wherein the shunt coil is physically wound around the superconductor body and wherein the superconductor component has means for reducing the circulating current which is induced within the electrical contacts by a magnetic field on current flow within the shunt coil, wherein the means for reducing the induced currents is at least one selected from the group consisting of: providing at least one cut into the wall of the electrical contact; and adjusting the ratio of cross sectional area of the electrical contact and the cross sectional area of the superconductor body to be less than 2.

2. A superconductor component according to claim 1, wherein the shunt coil is connected electrically in parallel to the superconductor body.

3. A superconductor component according to claim 1, wherein the electrical contacts protrude at least partially out of the end of the shunt coil.

4. A superconductor component according to claim 1, wherein the at least one cut is a through-cut.

5. A superconductor component according to claim 1, wherein the number of the cuts is 2 or more.

6. A superconductor component according to claim 1, wherein the at last one cut is an indent.

7. A superconductor component according to claim 1, wherein the ratio of the cross sectional area of the electrical contact and the superconductor body is less than 1.8.

8. A superconductor component according to claim 1, wherein the ratio of the cross sectional area of the electrical contact and the superconductor body is not less than 1.

9. A superconductor component according to claim 1, wherein the superconductor component has a round or oval cross sectional geometry.

10. A superconductor component according to claim 9, wherein the superconductor body is a rod or a tube.

11. A superconductor component according to claim 1, wherein the superconductor body is obtained by a melt casting process.

12. Method for reducing currents which are induced within the electrical contacts of a superconductor component according to claim 1, by providing means for reducing currents which are induced within the electrical contacts by the non-uniformity of the magnetic field at the ends of the shunt coil.

13. Method according to claim 12, wherein the means for reducing the induced currents is at least one selected from the group consisting of:
   providing at least one cut into the wall of at least one electrical contact; and
   adjusting the ratio of the cross sectional area of at least one electrical contact and the superconductor body to be less than 2.

14. A method employing the superconductor component in accordance with claim 1, said method comprising the step of: employing said superconductor component in a fault current limiter.

* * * * *